(12) United States Patent
Canini et al.

(10) Patent No.: US 10,775,028 B2
(45) Date of Patent: Sep. 15, 2020

(54) PRINTED CIRCUIT BOARD APERTURE BASED ILLUMINATION SYSTEM FOR PATTERN PROJECTION

(71) Applicant: DATALOGIC IP TECH S.R.L., Lippo Di Calderara Di Reno (IT)

(72) Inventors: Federico Canini, Zola Predosa (IT); Anna Guagliumi, Calderara Di Reno (IT); Davide Bottazzi, Bologna (IT)

(73) Assignee: DATALOGIC IP TECH S.R.L., Lippo Di Calderara Di (IT)

( * ) Notice: Subject to any disclaimer, the term of this patent is extended or adjusted under 35 U.S.C. 154(b) by 0 days.

(21) Appl. No.: 14/567,766

(22) Filed: Dec. 11, 2014

(65) Prior Publication Data

US 2016/0169488 A1    Jun. 16, 2016

(51) Int. Cl.
*F21V 19/00* (2006.01)
*H05K 1/18* (2006.01)
(Continued)

(52) U.S. Cl.
CPC .......... *F21V 19/0015* (2013.01); *F21V 5/048* (2013.01); *F21V 11/12* (2013.01);
(Continued)

(58) Field of Classification Search
CPC ...... F21V 11/12; F21V 19/0015; F21V 5/048; H05K 1/183; H05K 2201/09063; H05K 2201/09072; H05K 2201/09845; H05K 2201/09854; H05K 2201/10106; H05K 2201/1527; H05K 3/4691
See application file for complete search history.

(56) References Cited

U.S. PATENT DOCUMENTS 5,859,418 A    1/1999  Li et al.
6,674,159 B1   1/2004  Peterson et al.
(Continued)

FOREIGN PATENT DOCUMENTS

DE    102008047406 A1    3/2010
DE    20 2013 011 008 U1  7/2014

OTHER PUBLICATIONS

International Search Report with Written Opinion dated Mar. 10, 2016 in Application No. PCT/IB2015/059555, 11 pages.
(Continued)

*Primary Examiner* — Zheng Song
(74) *Attorney, Agent, or Firm* — Shook, Hardy & Bacon L.L.P.

(57) ABSTRACT

A complex device that integrates a beam shaping aperture in a printed circuit board of the complex device (e.g., scanner or barcode reader or optical module) is provided. The complex device has a light-emitting diode pattern projection system. The pattern projection system includes one or more light-emitting diodes and a printed circuit board. The printed circuit board has one or more apertures and one or more receptacles. The one or more receptacles are positioned behind the aperture and receive the one or more light-emitting diodes. The printed circuit board with receptacle offer self-alignment for the light emitting diodes. The beam shaping aperture in front of the light-emitting diodes allows light to pass through the aperture that is part of the printed circuit board layer of the complex device.

10 Claims, 5 Drawing Sheets

(51) Int. Cl.
*H05K 1/02* (2006.01)
*F21V 5/04* (2006.01)
*F21V 11/12* (2006.01)
*H05K 3/46* (2006.01)
*F21Y 115/10* (2016.01)

(52) U.S. Cl.
CPC .......... *H05K 1/0274* (2013.01); *H05K 1/183* (2013.01); *F21Y 2115/10* (2016.08); *H05K 3/4691* (2013.01); *H05K 2201/09063* (2013.01); *H05K 2201/09072* (2013.01); *H05K 2201/09845* (2013.01); *H05K 2201/09854* (2013.01); *H05K 2201/10106* (2013.01); *H05K 2203/167* (2013.01)

(56) References Cited

U.S. PATENT DOCUMENTS

| | | | |
|---|---|---|---|
| 6,930,332 B2 | 8/2005 | Hashimoto et al. | |
| 6,949,771 B2 | 9/2005 | Yoganandan et al. | |
| 6,999,318 B2* | 2/2006 | Newby | F21K 9/00 257/706 |
| 7,044,620 B2* | 5/2006 | Van Duyn | F21V 29/763 362/227 |
| 7,556,400 B2* | 7/2009 | Wu | F21K 9/00 257/81 |
| 7,880,372 B2 | 2/2011 | Ichikawa et al. | |
| 8,037,584 B2 | 10/2011 | Park et al. | |
| 8,129,734 B2 | 3/2012 | Mazzochette | |
| 8,362,603 B2 | 1/2013 | Lim et al. | |
| 2002/0024808 A1* | 2/2002 | Suehiro | G09F 9/33 362/245 |
| 2002/0180923 A1 | 12/2002 | Aoyagi et al. | |
| 2004/0027067 A1 | 2/2004 | Song et al. | |
| 2004/0032728 A1* | 2/2004 | Galli | H01L 33/60 362/84 |
| 2004/0227146 A1* | 11/2004 | Wu | H01L 33/62 257/99 |
| 2004/0233650 A1 | 11/2004 | Miyashita et al. | |
| 2007/0041190 A1* | 2/2007 | Chou | F21K 9/00 362/249.16 |
| 2008/0225508 A1* | 9/2008 | Liu | H01H 13/83 362/23.03 |
| 2008/0285303 A1* | 11/2008 | Matsui | G02B 6/4201 362/580 |
| 2009/0126980 A1 | 5/2009 | Katsuta | |
| 2009/0297103 A1* | 12/2009 | Sheau Tung Wong | G02B 6/4206 385/88 |
| 2010/0182788 A1* | 7/2010 | Luo | F21V 29/71 362/253 |
| 2011/0163649 A1* | 7/2011 | Kurosawa | F21K 9/00 313/46 |
| 2012/0201007 A1* | 8/2012 | Yeh | H05K 1/0203 361/719 |
| 2013/0027953 A1* | 1/2013 | Krier | B60K 35/00 362/509 |
| 2014/0125213 A1 | 5/2014 | Kong et al. | |
| 2014/0334159 A1* | 11/2014 | Ferguson | A61B 90/35 362/311.02 |
| 2015/0049484 A1* | 2/2015 | Preuschl | F21V 27/02 362/249.01 |
| 2016/0033713 A1* | 2/2016 | Sun | G02B 6/0055 362/607 |

OTHER PUBLICATIONS

Office Action received for European Patent Application No. 15819879.6, dated Apr. 16, 2020, 5 pages.

* cited by examiner

PRINTED CIRCUIT BOARD APERTURE BASED ILLUMINATION SYSTEM FOR PATTERN PROJECTION

CROSS-REFERENCE TO RELATED APPLICATION

Not applicable.

STATEMENT REGARDING FEDERALLY SPONSORED RESEARCH OR DEVELOPMENT

Not applicable.

BACKGROUND

Conventionally, light-emitting diodes are part of complex devices (e.g., traffic light, media players, camera, cell phone, or scanners). The complex devices are becoming smaller and smaller as technological advancements allow mass production at the micron level. A complex device may include several light-emitting diodes that are soldered to multiple layers of the complex device. Typically, electrical contacts of the light-emitting diodes are attached via solder or electrically conductive adhesive to the complex device. The electrical contacts of the light-emitting diodes may be connected at several locations in the complex device.

The electrical contacts of the light emitting diodes receive power from a power source. The power source may include electrical outlets, batteries or alternative forms of energy (e.g. wind, solar, water). The electrical contacts may be electrically connected to the power source via wire bonds. Electrical power provided from the power source to the complex device may cause light to be emitted from the light-emitting diodes.

As the complex devices become smaller and thinner obtaining the appropriate dimensions for shaping the beam of light generated by the light-emitting diodes presents some challenges. One of the challenges is providing enough space for the contact, wires, and beam of light while maintaining the appropriate alignment of the light-emitting diodes within the complex devices.

SUMMARY

The embodiments of the invention overcoming these and other problems in the industry relate in one regard to devices for, among other things, providing the proper alignment of several components of complex devices in a smaller area without sacrificing the properties of the projected light generated by the light-emitting diodes.

In one embodiment, the complex devices include a light-emitting diode pattern projection system. The light-emitting diode pattern projection system has one or more light-emitting diodes and a printed circuit board. The printed circuit board has one or more apertures and one or more receptacles. The one or more receptacles are positioned behind the one or more apertures and receive the one or more light-emitting diodes.

In another embodiment, a complex device includes a printed circuit board, a flexible circuit member, and one or more light-emitting diodes. The printed circuit board has one or more receptacles. The flexible circuit member is coupled to the printed circuit board. In some embodiments, the flexible circuit member has at least one aperture. The one or more light-emitting diodes are positioned within the one or more receptacles of the printed circuit board. In some embodiments, the one or more light-emitting diodes are aligned with the receptacle via the flexible circuit member. The one or more light-emitting diodes may be soldered to the flexible circuit member. In an alternate embodiment, the one or more light-emitting diodes are soldered to the printed circuit board.

Accordingly, embodiments of the invention provide a pattern projection device that integrates a beam shaping aperture in a printed circuit board of the complex device (e.g., scanner, barcode reader, or an optical module). The printed circuit board with receptacle offer self-alignment for the light emitting diodes. Moreover, the rigid-flex printed circuit boards (which are not just a flexible printed circuit board but a combination of a rigid printed circuit board and a flexible printed circuit board that can be "folded") can be used to realize a one piece foldable light-emitting diode and beam shaping aperture structure. By adding a lens system to the aperture structure, a complex device providing a sharp edged illumination (aiming/good read) pattern can be manufactured. In other words, the beam shaping aperture in front of the light-emitting diode allows the complex device to select part of the light rays emitted by the light emitting diode. These light rays can be redirected by an additional lens system (beam shaping) to project a light pattern.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

Illustrative embodiments of the invention are described in detail below with reference to the attached figures, which are incorporated by reference herein and wherein.

DETAILED DESCRIPTION

Embodiments of the invention provide devices having apertures that select a portion of the light generated by light-emitting diodes. The apertures are etched or machined (not limited to this fabrication techniques) into printed circuit boards of the devices. The printed circuit board layer with apertures may also include receptacles for hosting the light-emitting diodes and aligning it to the apertures (at least in one direction). The devices configured in accordance with embodiments of the invention may be used as scanners, cameras, media players, optical modules, etc.

As utilized herein, the term "aperture" means a surface that does not stop light and refers to describe both a "single aperture" and a "multi-aperture" configuration.

As utilized herein, the term "front soldered light-emitting diode" means a light-emitting diode that is soldered to the top surface of a printed circuit board, flexible circuit board, or foldable circuit board.

As utilized herein, the term "back soldered light-emitting diode" means a light-emitting diode that is soldered to the back surface of a printed circuit board, flexible circuit board, or foldable circuit board.

In some embodiments, the printed circuit board stack may include a layer made by a flexible substrate (flexible circuit component). The flexible circuit component in addition to the receptacle may be used to align light-emitting diodes with the aperture of the printed circuit board. The flexible circuit component may have the light-emitting diodes soldered on it.

In one embodiment, the entire complex device may be fabricated as a molded interconnected device. The device is created based on a three-dimensional molded (or laser patterned) substrate on which electrical connections and wires are implemented. A fabrication process called "MIPTEC" by Panasonic Corporation may be used to achieve very high precision fabrication of three-dimensional ceramic or resin substrates. Accuracy for fabrication is in the range of tens of micron. Wire bonding and flip-chip mounting of the light emitting diode die may also be used.

The three-dimensional fabrication provides precise alignment between the apertures and the light emitting diodes in a very compact size (e.g., possible to design a printed circuit board, light-emitting diodes, and aperture assembly with less than one millimeter thickness). The assembly may be made of ceramic material to dissipate the heat from the light-emitting diodes, which may be front-soldered or back-soldered.

In accordance with embodiments of the invention, the devices may be fabricated to be used as illumination system for the reading of 1D barcodes. The device may have one or more of the following characteristics: illumination pattern with sharp edges, compact size (aperture-LED distance about 0.2 mm, total track less than 10 mm), precise and reliable alignment between the aperture and the other components of the system, high mechanical robustness, and low cost realization.

Figure 1:
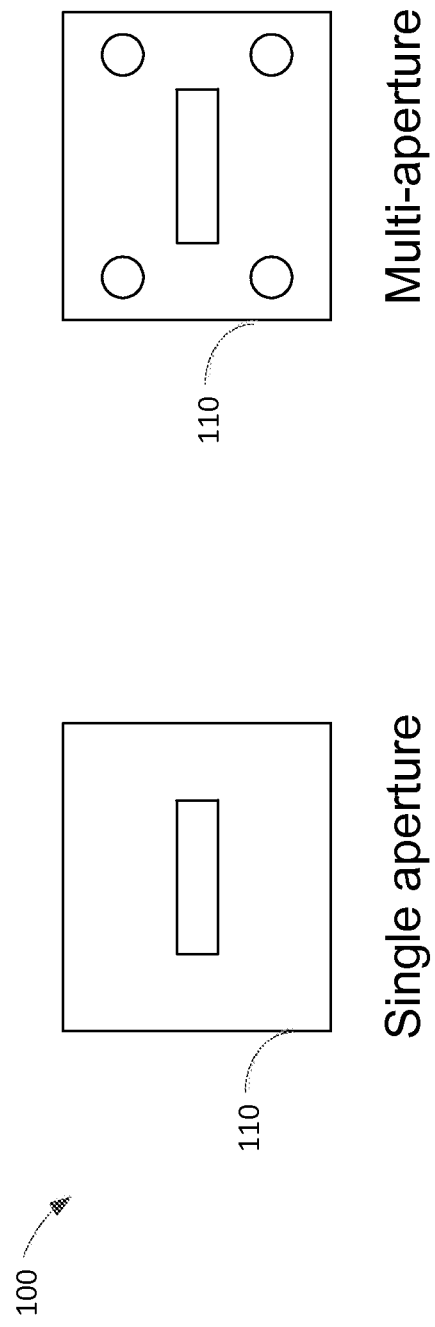
FIG. 1 illustrates an exemplary aperture and printed circuit board of a complex device in accordance with embodiments of the invention.
Figure 1:
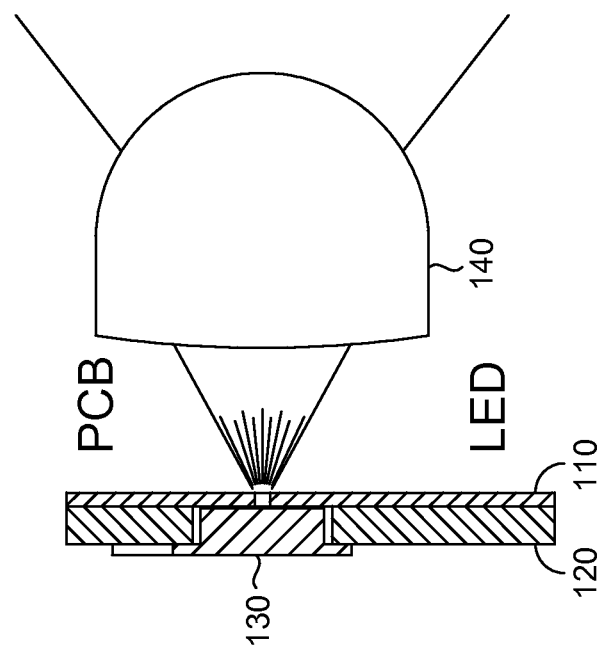

FIG. 1 illustrates an exemplary aperture 110 and printed circuit board 120 of a complex device in accordance with embodiments of the invention. In one embodiment, the complex device may be included inside a pattern projection system 100 for an aiming system or for providing visual feedback to the user. The pattern projection system 100 includes the printed circuit board, which is etched or machined with the aperture 110 and a lens system 140.

A desired pattern for illuminating, aiming, or providing visual feedback may be projected by the pattern projection system 100. The shape of the projected pattern depends both on the lenses 140 and on the aperture 110. The light-emitting diodes 130 (e.g., front-soldered light-emitting diodes or back-soldered light-emitting diodes) may be soldered to the printed circuit board 120.

In one embodiment, the light-emitting diodes 130 are chosen to maintain small compact dimensions and high efficiency in light extraction. In particular, a small emitting area is a key factor for achieving a compact system. Soldering a light-emitting diode on the front surface of the printed circuit board 120 is a front-soldered light-emitting diode. Alternatively, soldering a light-emitting diode on the back surface of the printed circuit board 120 is the back-soldered light-emitting diodes.

The pattern projection system 100 is composed of one or more light emitting diodes 130, an aperture, and one or more lenses. The assembly of all the parts in one structure guarantees the correct alignment between all the components and provides the needed mechanical robustness. In some embodiments, the aperture is created directly in the printed circuit board during the fabrication processes. Accordingly, the printed circuit board 120 may be an optical component of the pattern projection system 100.

In some embodiments, the lenses of the pattern projection system 100 are optimized for reducing the aberrations of the projected pattern, obtaining sharp edges, uniform light intensity and high efficiency. The optical structure may include one or more lenses that are spherical, aspherical or free-form. The lenses may be made from a plastic material or glass.

In some embodiments, a back-soldered light-emitting diode is placed in a receptacle of a printed circuit board. The printed circuit board is fabricated with one or more receptacles and one or more apertures. The receptacles may be shaped to align the light-emitting diodes with the apertures.

Figure 2:
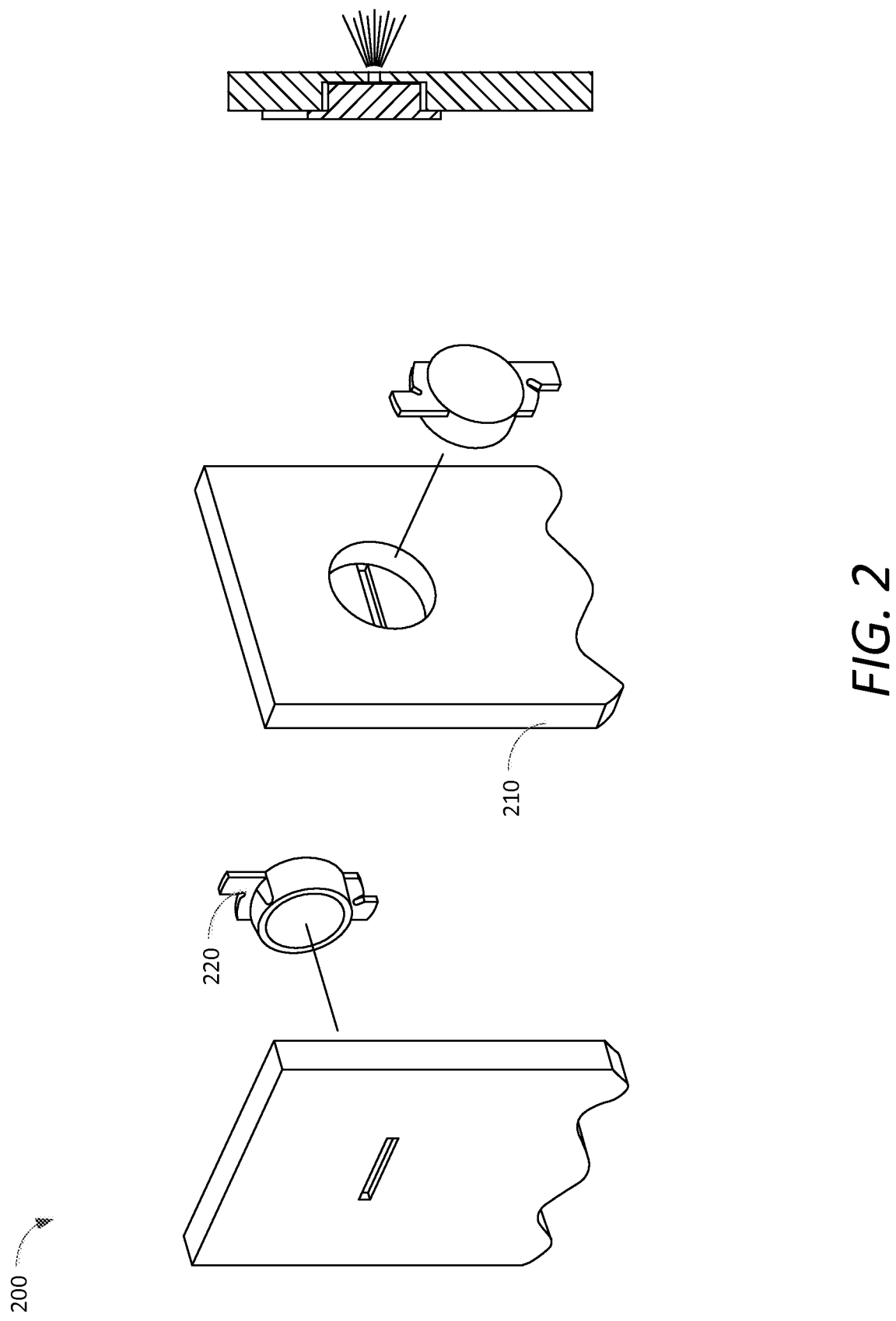
FIG. 2 illustrates an exemplary configuration of a light emitting diode projection system in accordance with embodiments of the invention.

FIG. 2 illustrates an exemplary configuration of a light emitting diode projection system 200 in accordance with embodiments of the invention. The light emitting diode projection system 200 includes a printed circuit board 210 having a receptacle and aperture. The light-emitting diode 220 is placed in the receptacle and the light generated by the light-emitting diode 220 traverses the aperture of the printed circuit board 210. In one embodiment, the light-emitting diode is a back-soldered light-emitting diode.

In one embodiment, the aperture and receptacle are created directly in the printed circuit board 210 by exploiting one of the metal layers of the printed circuit board. Both the receptacle and the aperture of the metal layer can be created by shaping the aperture and receptacle during fabrication. Materials used during fabrication include FR4 for the substrate and copper for the metal layers but the embodiments of the invention are not limited to these materials. During fabrication of the light emitting diode projection system 200, the minimum thickness of the aperture depends on the thickness of the metal layer on which the aperture is fabricated. However, the maximum thickness of the assembly including the light-emitting diode and printed circuit board may be about one millimeter in accordance with embodiments of the invention.

Accordingly, the printed circuit board is configured to provide, among other things, precise alignment between the aperture and the light-emitting diode and a compact light emitting diode projection system 200 (i.e., printed-circuit board, light-emitting diode, aperture assembly may have less than one mm thickness).

In other embodiments, a complex device may include a combination of more than one substrate with spacers for ensuring proper alignment. The substrates include a printed circuit board substrate, receptacle substrate, and aperture substrate. A front-soldered or back-soldered light-emitting diode is placed in a receptacle substrate above the printed circuit board substrate. The aperture substrate is placed above the receptacle substrate. The receptacles of the receptacle substrate may be shaped to align the light-emitting diodes with the apertures.

Figure 3:
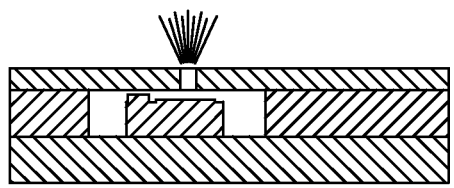
FIG. 3 illustrates an exemplary buffer zone in the complex device in accordance with embodiments of the invention.
Figure 3:
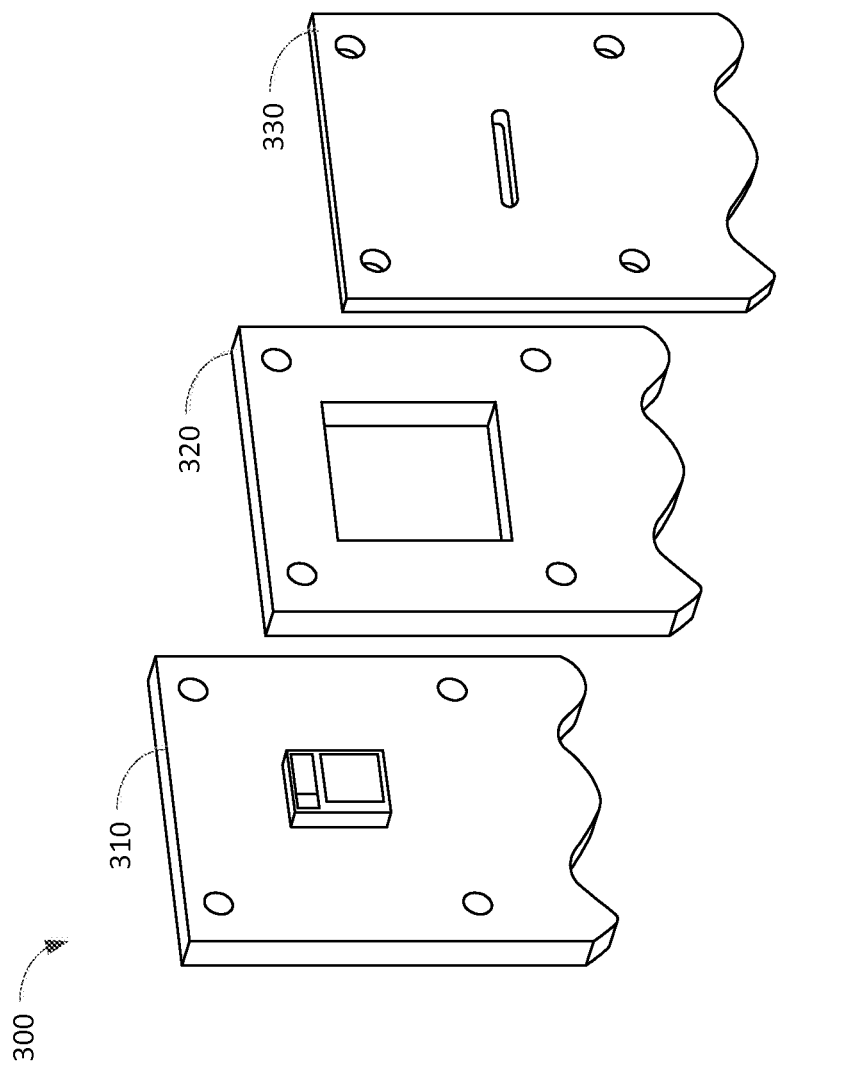

FIG. 3 illustrates an exemplary buffer zone in the complex device 300 in accordance with embodiments of the invention. The complex device 300 may include several substrates (310, 320, and 330) that are aligned to position the light-emitting diode for a projection system. The substrates include a printed circuit board layer 310, a receptacle substrate 320, and an aperture substrate 330.

The printed circuit board substrate 310 may include a light-emitting diode. The light emitting diode is soldered to the printed circuit board substrate 310. The printed circuit board substrate 310 may include a plurality of pinholes to receive pins or contacts that align each of the substrates (310, 320, and 330).

Above the printed circuit board substrate 310 is a receptacle substrate 320. The receptacle substrate may operate as a spacer between the printed circuit board substrate 310 and the aperture substrate 330. The receptacle substrate 320 may include a receptacle for the light-emitting diode. The receptacle in the receptacle substrate 320 may be used to align the light-emitting diode with the aperture of the aperture substrate 330. Additionally, the receptacle substrate 320 may be used to alter a distance between the light-emitting diode and the aperture by increasing or decreasing the size of the receptacle substrate 320.

In some embodiments, the aperture is created in aperture substrate 330. The aperture substrate 330 may consist of a substrate with one or more holes for light to pass through. The aperture substrate 330 is positioned in front of the light emitting diode that is soldered to the printed circuit board substrate 310. The aperture substrate 330 is also positioned in front of the receptacle substrate 320.

In one embodiment, the aperture substrate is at a distance from the printed circuit board defined by the size of the receptacle substrate 320. Both the receptacle substrate 320 and aperture substrate 330 may be fabricated from FR4, plastic, or metal materials (but not limited to). The alignment of the substrates (310, 320, and 330) may be guaranteed by the mechanical structure (e.g., 2 or more pins passing through pinholes in all the layers. Optionally, the pins can be electrically conductive and used as electric contacts to connect the device to a driving circuit.

Accordingly, embodiments of the invention provide a complex device with small and thin apertures that are operable with either front-soldered light-emitting diodes or back-soldered light-emitting diodes.

In other embodiments, the printed circuit board may include a flexible circuit attachment. Optionally, the flexible circuit attachment may be used to position the light emitting diode in a receptacle of the printed circuit board.

Figure 4:
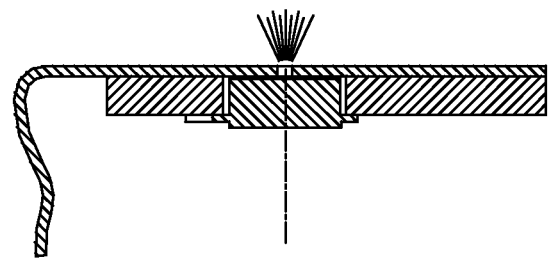
FIG. 4 illustrates an exemplary rigid printed circuit board and flexible circuit board in accordance with embodiments of the invention.
Figure 4:
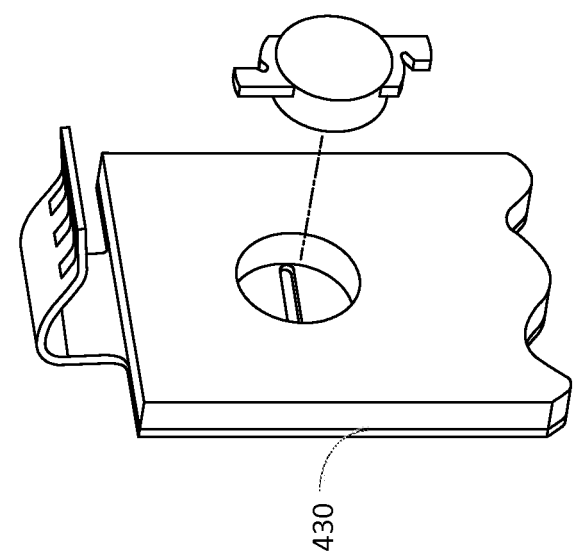
Figure 4:
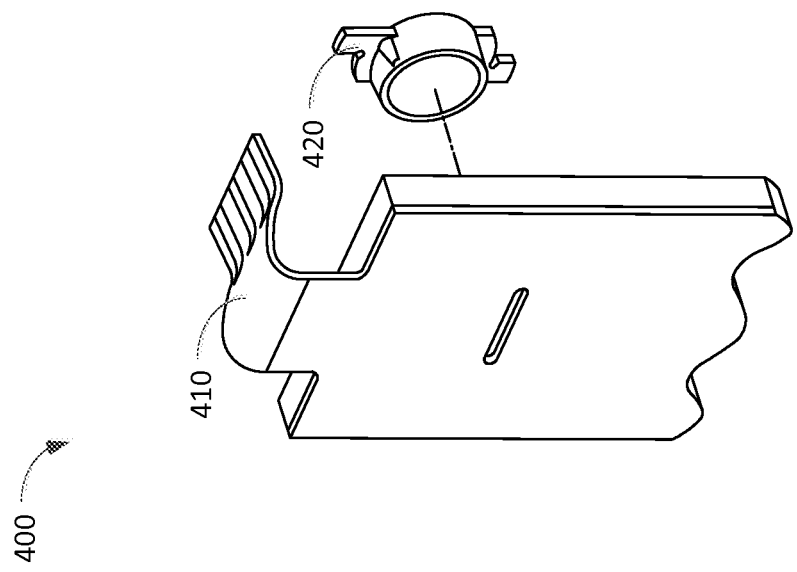

FIG. 4 illustrates an exemplary rigid printed circuit board 430 and flexible circuit board 410 in accordance with embodiments of the invention. The complex device 400 may include a flexible circuit board 410, light-emitting diode 420, and printed circuit board 430.

The flexible circuit board 410 may be optionally engaged to align the light emitting diode 420 with an aperture of the printed circuit board 430. The flexible circuit board, in some embodiments, is attached to the printed circuit board 430 along one of the edges. The flexible circuit board 410 is foldable to position the light-emitting diode 420 in the receptacle of the printed circuit board 430.

The printed circuit board 430 is fabricated with the aperture and receptacle in certain embodiments. The printed circuit board 430 may include an area for soldering the light-emitting diode 420. After the light-emitting diode 420 (e.g. back-soldered light-emitting diode) is positioned within the receptacle it may be soldered to the printed circuit board.

Accordingly, embodiments of the invention provide a flexible circuit board that may be engaged to align the light-emitting diode in the receptacle of the printed circuit board. The light-emitting diodes are then soldered to the printed circuit board. The light generated by the light-emitting diodes pass through an aperture of the printed circuit board.

In one embodiment, a complex device may include a foldable circuit board that is fabricated with the aperture. The foldable circuit board may be a substrate that is positioned above the printed circuit board or in between other substrates of the printed circuit board. The foldable circuit board, in certain embodiments, may include wires that are soldered to light-emitting diodes. In some embodiments, the complex device includes the printed circuit board, the foldable circuit board, and one or more light-emitting diodes. The printed circuit board may have one or more receptacles. The foldable circuit member, in turn, is coupled to the printed circuit board. And the foldable circuit board may have at least one aperture. The one or more light-emitting diodes are positioned within the one or more receptacles of the printed circuit board.

Figure 5:
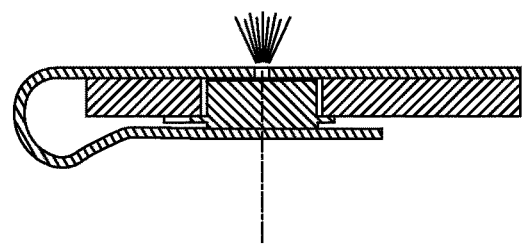
FIG. 5 illustrates an exemplary foldable circuit board providing self-alignment in accordance with embodiments of the invention.
Figure 5:
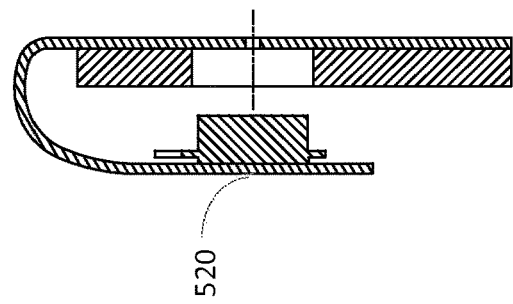
Figure 5:
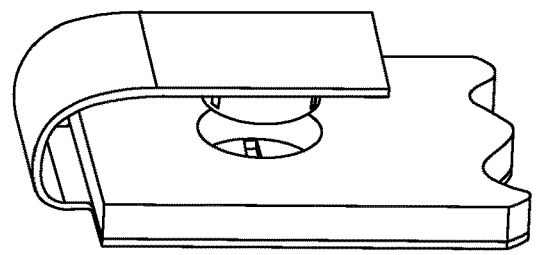
Figure 5:
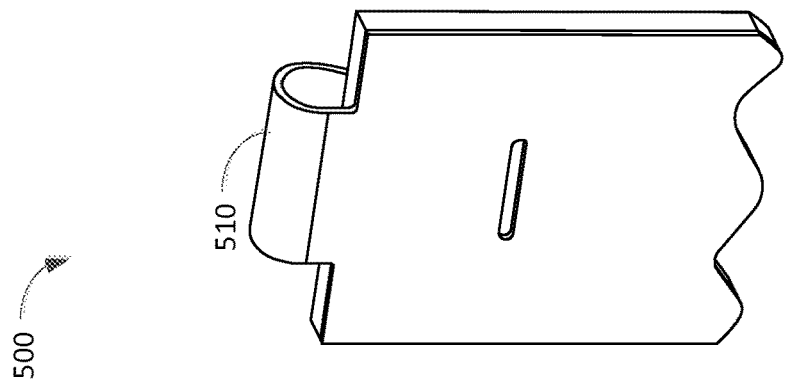

FIG. 5 illustrates an exemplary foldable circuit board 510 providing self-alignment in accordance with embodiments of the invention. The complex device 500 includes a printed circuit board with a foldable circuit board 510. In one embodiment, the foldable circuit board 510 is a substrate that is positioned above the printed circuit board or in between other substrates of the printed circuit board. An aperture may be fabricated in the foldable circuit board 510. And the printed circuit board may include one or more receptacles to receive the one or more light emitting diodes. The one or more light-emitting diodes are aligned with the one or more receptacles via the foldable circuit board 510.

In one embodiment, the one or more light-emitting diodes are soldered to the foldable circuit board 510. In other embodiments, the one or more light-emitting diodes are soldered to the printed circuit board. The one or more light-emitting diodes are selected from: front-soldered light emitting diodes or back-soldered light emitting diodes.

Accordingly, the foldable circuit member 510 provides precise alignment of light-emitting diodes with the aperture of the foldable circuit board 510 and the receptacle of the printed circuit board. The printed circuit board, foldable circuit board, light-emitting diode assembly may be fabricated in a compact size (e.g., at most one millimeter thickness).

In summary, several configurations for a light-emitting diodes projection system are explained above. The complex devices with light-emitting diode projection system may be scanning device in at least one embodiment. The scanning device includes one or more light-emitting diodes, and a printed circuit board. The printed circuit board is fabricated with one or more apertures and one or more receptacles, in one embodiment. The printed circuit board consists of: a base substrate, a receptacle substrate, and an aperture substrate. The one or more receptacles are positioned behind the aperture and configured to receive the one or more light-emitting diodes. A lens is disposed above the one or more apertures of the printed circuit board, which may be a ceramic material.

The foregoing descriptions of the embodiments of the invention are illustrative, and modifications in configuration and implementation will occur to persons skilled in the art. Although the subject matter has been described in language specific to structural features or methodological acts, it is to be understood that the subject matter defined in the appended claims is not necessarily limited to the specific features or acts described above. Rather, the specific features and acts described above are disclosed as example forms of The technology claimed is:

1. A complex device comprising:
a rigid printed circuit board with one or more receptacles;
a flexible circuit member coupled to a front face of the rigid printed circuit board, wherein the flexible circuit member has an aperture layer having at least one aperture that aligns with the one or more receptacles,
one or more light-emitting diodes positioned within the one or more receptacles of the rigid printed circuit board, the one or more light-emitting diodes being distanced from the aperture layer and oriented such that the light rays are directed outwardly from the light-emitting diodes toward the at least one aperture,
wherein the aperture layer is configured to restrict a portion of a plurality of light rays emitted by the one or more light-emitting diodes to create one or more desired patterns for illuminating, aiming, or providing a visual feedback, and
wherein the one or more light-emitting diodes are front-soldered to the flexible circuit member and positioned in the receptacle from a back side of the rigid printed circuit board via a foldable portion of the flexible circuit member.

2. The complex device of claim 1, further comprising at least one lens disposed above the at least one aperture.

3. The complex device of claim 2, wherein the printed circuit board is ceramic or resin.

4. The complex device of claim 1, wherein the aperture layer includes a metal material.

5. The complex device of claim 1, wherein the aperture layer includes a plastic material.

6. The complex device of claim 1, wherein the rigid printed circuit board and the one or more light-emitting diodes within their respective receptacles and aperture layer have a combined thickness less than 1 millimeter.

7. The complex device of claim 1, wherein the one or more receptacles are etched into the rigid printed circuit board.

8. The complex device of claim 1, further comprising a scanning device including a barcode reader that includes the rigid printed circuit board, the flexible circuit member, and the one or more light-emitting diodes.

9. The complex device of claim 1, wherein the aperture layer having at least one aperture is a single aperture configuration.

10. The complex device of claim 1, wherein the aperture layer having at least one aperture is a multi-aperture configuration.

* * * * *